(12) United States Patent
Chaparala et al.

(10) Patent No.: US 9,472,479 B2
(45) Date of Patent: Oct. 18, 2016

(54) METHODS AND APPARATUS FOR PROVIDING AN INTERPOSER FOR INTERCONNECTING SEMICONDUCTOR CHIPS

(71) Applicant: CORNING INCORPORATED, Corning, NY (US)

(72) Inventors: Satish Chandra Chaparala, Painted Post, NY (US); Scott Christopher Pollard, Big Flats, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 14/608,537

(22) Filed: Jan. 29, 2015

(65) Prior Publication Data

US 2015/0221571 A1    Aug. 6, 2015

Related U.S. Application Data

(60) Provisional application No. 61/934,366, filed on Jan. 31, 2014.

(51) Int. Cl.
*H01L 21/00* (2006.01)
*H01L 23/15* (2006.01)
(Continued)

(52) U.S. Cl.
CPC .......... *H01L 23/15* (2013.01); *H01L 23/49822* (2013.01); *H01L 24/81* (2013.01);
(Continued)

(58) Field of Classification Search
CPC .......... H01L 2224/32225; H01L 2924/00014; H01L 2224/73265; H01L 2224/16225; H01L 2924/15311; H01L 2924/014; H01L 2924/01079; H01L 2924/01029; H01L 23/49827; H01L 2924/01006; H01L 2924/01019; H01L 23/49816
USPC ........................................................ 438/125
See application file for complete search history.

(56) References Cited

U.S. PATENT DOCUMENTS 4,221,047 A    9/1980    Narken et al.
5,209,798 A *  5/1993    Solomon .............. B65G 49/069
                                                      156/153

(Continued)

FOREIGN PATENT DOCUMENTS

EP          0016306          1/1980

OTHER PUBLICATIONS

Hisada, T. et al. Study of Warpage and Mechanical Stress of 2.5D Package Interposers During Chip and Interposer Mount Process; Proceedings—2012 45th International Symposium on Microelectronics, IMAPS 2012, p. 967-974, 2012.

(Continued)

*Primary Examiner* — Tod T Van Roy
*Assistant Examiner* — Vu A Vu
(74) *Attorney, Agent, or Firm* — John T. Haran

(57) ABSTRACT

Methods and apparatus are provide for an interposer for interconnecting one or more semiconductor chips with an organic substrate in a semiconductor package, the interposer including: a first glass substrate having first and second opposing major surfaces, the first glass substrate having a first coefficient of thermal expansion (CTE1); a second glass substrate having first and second opposing major surfaces, the second glass substrate having a second coefficient of thermal expansion (CTE2); and an interface disposed between the first and second glass substrates and joining the second major surface of the first glass substrate to the first major surface of the second glass substrate, where CTE1 is less than CTE2, the first major surface of the first glass substrate operates to engage the one or more semiconductor chips, and the second major surface of the second glass substrate operates to engage the organic substrate.

17 Claims, 3 Drawing Sheets

(51) Int. Cl.
*H01L 23/00* (2006.01)
*H05K 1/02* (2006.01)
*H05K 1/18* (2006.01)
*H01L 23/498* (2006.01)

(52) U.S. Cl.
CPC .......... *H05K 1/0201* (2013.01); *H05K 1/181* (2013.01); *H01L 23/49833* (2013.01); *H01L 2924/12042* (2013.01); *H01L 2924/15788* (2013.01); *H05K 2201/068* (2013.01)

(56) References Cited

U.S. PATENT DOCUMENTS

| | | | |
|---|---|---|---|
| 6,399,892 B1* | 6/2002 | Milkovich | H01L 23/3735 174/258 |
| 6,516,513 B2 | 2/2003 | Milkovich et al. | |
| 7,221,050 B2* | 5/2007 | Palanduz | H01L 21/4857 174/255 |
| 2005/0023032 A1 | 2/2005 | Kawai et al. | |
| 2006/0043567 A1 | 3/2006 | Palanduz | |
| 2013/0063918 A1* | 3/2013 | Haba | H01L 23/49827 361/772 |
| 2013/0207214 A1* | 8/2013 | Haddad | H01L 31/0236 257/432 |

OTHER PUBLICATIONS

Qin, X et al. Highly-Reliable Silicon and Glass Interposers-to-Printed Wiring Board SMT Interconnections: Modeling, Design, Fabrication and Reliability; Proceedings—Electronic Components and Technology Conference; p. 1738-1745; 2012.

Patent Cooperation Treaty International Notification of Transmittal of the International Search Report and The Written Opinion of the International Searching Authority, International application No. PCT/US2015/013405: mailing date Apr. 29, 2015, 10 pages.

* cited by examiner

METHODS AND APPARATUS FOR PROVIDING AN INTERPOSER FOR INTERCONNECTING SEMICONDUCTOR CHIPS

CROSS-REFERENCE TO RELATED APPLICATIONS

This application claims the benefit of priority under U.S.C. §119 of U.S. Provisional Application Ser. No. 61/934,366 filed on Jan. 31, 2014 the content of which is relied upon and incorporated herein by reference in its entirety.

BACKGROUND

The present disclosure relates to methods and apparatus for providing an interposer for interconnecting semiconductor chips.

Semiconductor packaging technologies have evolved in significant ways over the years. Early on, the approach to package higher complexity semiconductor circuits (and therefore achieving higher functionality and performance in a given package) was to increase the size of a semiconductor chip in two dimensions within the package. As a practical matter, one cannot expand laterally in two dimensions without bound because eventually the design will suffer in terms of power and signal routing complexities, power dissipation problems, performance problems, manufacturing yield problems, etc. In addition, at present there are practical limitations preventing the manufacture of two different semiconductor fabrication processes on a common semiconductor wafer, which also limits the circuit design options available to an artisan.

The above problems associated with expanding a semiconductor chip in two dimensions has led artisans to explore ways of expanding in three dimensions; namely, by expanding vertically. Earlier approaches to vertical expansion of semiconductor chips included chip stacking, such as placing memory chips one atop the other within a single package. While this certainly yielded higher chip density over a single chip package (given a fixed lateral area) there are disadvantages and practical limitations with chip stacking, including power and performance issues, manufacturing yield problems and the like. Another conventional approach to vertical expansion in semiconductor packaging included so-called package-on-package techniques, where a number of separate ball grid array packages are assembled one atop the other (in a stacked arrangement), with a standard interface to route signals between them. The package on package technique also results in higher chip density, although there are inefficiencies with employing separate packages for each semiconductor chip.

Still further approaches to vertical expansion in semiconductor packaging include so-called 2.5-D and 3-D integration, whereby a silicon interposer is employed to interconnect two or more semiconductor chips within a single package. The primary function of the interposer is to provide interconnectivity in such a way that the two or more semiconductor chips may employ high terminal pitch and avoid the need for vias through the semiconductor chips themselves. The technique involves flipping the semiconductor chips over from their usual configuration and orienting the chip substrates up and chip-sides down. The chips are provided with micro-bump terminals (at high pitch), which are connected to corresponding terminals on a top side of the silicon interposer. The opposite, bottom side of the silicon interposer is connected to the package substrate (which is typically organic) by way of suitable terminals, usually Controlled Collapse Chip Connection (C4) joints. The interposer is provided with through silicon vias (TSVs) so that electrical connections may be made from the terminals of the semiconductor ships on the top side of the silicon interposer to the terminals of the package substrate at the bottom side of the silicon interposer. Notably, such a configuration permits the 2.5-D integration of the separate semiconductor chips without requiring TSVs on the active die of the semiconductor chips, which avoids significant complications. The 3-D integration may involve at least one semiconductor chip having TSVs in order to vertically and directly connect two semiconductor chips together and then to connect the combination to the silicon interposer for connection with other semiconductor ships.

While the silicon interposer is a promising and useful technology to achieve vertical integration of semiconductor chips, the conventional interposer technology is not without problems, particularly in terms of mismatches in coefficients of thermal expansion (CTEs) through the stack, including CTE match-up between the silicon interposer and the organic package substrate. Undesirable CTE mismatches may result in failures in the interconnections between the semiconductor chips and the silicon interposer and/or failures in the interconnections between the silicon interposer and the package substrate.

Accordingly, there are needs in the art for new methods and apparatus for providing interposers for interconnecting semiconductor chips.

SUMMARY

It has been discovered that significant advantages in the vertical integration of semiconductor chips may be achieved by employing an interposer formed from glass, whereby the designer is provided with mechanisms for achieving degrees of design freedom in the elastic modulus and CTE of the interposer. These freedoms in design may be used to engineer the interposer in a way that reduces CTE mismatches and increases the reliability and durability of the overall package.

In accordance with one or more aspects of the embodiments herein, methods and apparatus provide for an interposer for interconnecting one or more semiconductor chips with an organic substrate in a semiconductor package. The interposer may include a first glass substrate having first and second opposing major surfaces, the first glass substrate having a first coefficient of thermal expansion (CTE1); a second glass substrate having first and second opposing major surfaces, the second glass substrate having a second coefficient of thermal expansion (CTE2); and an interface disposed between the first and second glass substrates and joining the second major surface of the first glass substrate to the first major surface of the second glass substrate. By way of example, CTE1 may be less than CTE2, where the first major surface of the first glass substrate operates to engage the one or more semiconductor chips, and the second major surface of the second glass substrate operates to engage the organic substrate.

The interface may be formed from one or more of an adhesive material (such as a UV curable epoxy), an oxide bond (such as a silicon-oxide bond), and an intermediate glass material having a melting temperature significantly lower than melting temperatures of the first and second glass substrates.

In one or more alternative embodiments, the interposer may further include a third glass substrate having first and second opposing major surfaces, the third glass substrate having a third coefficient of thermal expansion (CTE3), wherein the second and third glass substrates are fused such that the second major surface of the second glass substrate is connected to the first major surface of the third glass substrate.

Assuming that the first major surface of the first glass substrate is adapted to engage the one or more semiconductor chips, and the second major surface of the third glass substrate is adapted to engage the organic substrate, then the respective CTEs may adhere to the following relationship: CTE1 is less than CTE2, and CTE3 is less than CTE2. Alternatively, the respective CTEs may adhere to the following relationship: CTE1 is less than CTE2, and CTE2 is less than CTE3.

Other aspects, features, and advantages will be apparent to one skilled in the art from the description herein taken in conjunction with the accompanying drawings.

DESCRIPTION OF THE DRAWINGS

For the purposes of illustration, one or more embodiments are shown in the drawings, it being understood, however, that the embodiments disclosed and described herein are not limited to the precise arrangements and instrumentalities shown.

DETAILED DESCRIPTION

Various embodiments disclosed herein are directed to methods and apparatus for providing an interposer formed from glass for interconnecting one or more semiconductor chips with an organic substrate in a semiconductor package.

Figure 1:
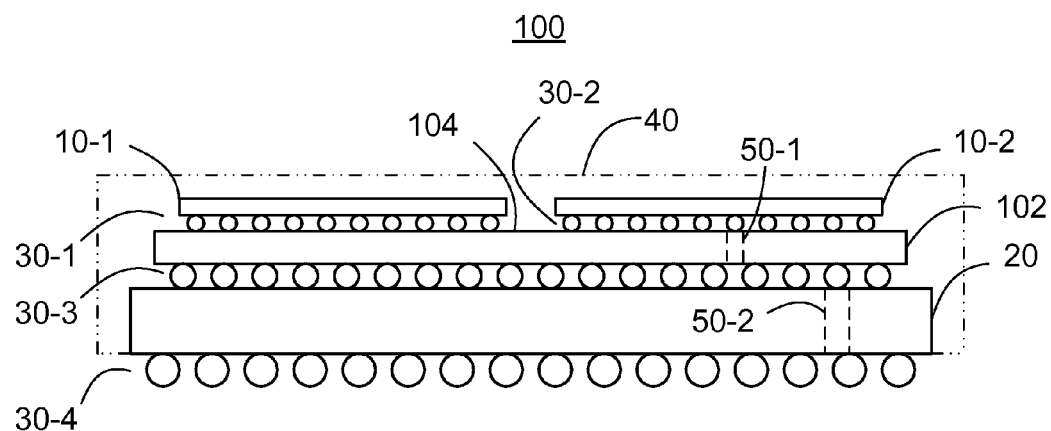
FIG. 1 shows a vertically integrated structure, which schematically illustrates certain features of 2.5-D integration, and includes an interposer having novel features.

With reference to FIG. 1, a vertically integrated structure 100 is shown, which schematically illustrates certain features of 2.5-D integration, albeit with a novel features not heretofore found in the prior art. In particular, the structure 100 includes a plurality of semiconductor chips 10-1, 10-2, which are coupled via connective mechanisms 30-1, 30-2, 30-3 to an organic package substrate 20 through an interposer 102. The structure 100 may further include a housing 40 providing a suitable level of encapsulation of the elements within. As is known in the art, the structure 100 may be connected to a printed circuit board (PCB, not shown) by connecting the package substrate 10 to the PCB via a connective mechanism 30-4. Among the contemplated implementations of the connective mechanisms 30-1, 30-2, 30-3, 30-4 is a ball grid array employing solder joints technology, although other know electrical interconnection techniques may be employed, such as through-hole techniques, other surface mount techniques, chip carrier techniques, pin grid arrays, etc.

The semiconductor chips 10-1, 10-2 may comprise memory circuitry, logic circuitry, micro-processing circuitry, digital circuitry, analog circuitry, etc., as is known in the art. In the illustrated example, the semiconductor chips 10-1, 10-2 are disposed laterally with respect to one another on a first major surface 104 of the interposer 102. The respective connective mechanisms 30-1, 30-2 provide interconnectivity from the respective semiconductor chips 10-1, 10-2 to the interposer 102. Although some elements are not shown for purposes of brevity and clarity, the interposer 102 may include multiple layers of metal traces, vias 50-1, decoupling capacitors, and other elements in order to facilitate the electrical interconnections between the connective mechanisms 30-1, 30-2 of the respective semiconductor chips 10-1, 10-2 and the package substrate 20. A second, opposing major surface 106 of the interposer 102 is coupled to the package substrate 20 by way of the connective mechanism 30-3. Among other elements, the vias 50-1 through the interposer 102 facilitate electrical interconnectivity from the connective mechanisms 30-1, 30-2 and the connective mechanism 30-3. As will be discussed in further detail later in this description, the particular material(s) and implementation of the interposer 102 is of importance.

The package substrate 20 may also include one or more metal layers, vias 50-2, etc. to complete the interconnectivity from the connective mechanism 30-3 of the interposer 102 to the printed circuit board. The package substrate 20 may be formed from an organic material, such as commonly available epoxy-based materials, resin-based materials, and the like.

Figure 2:
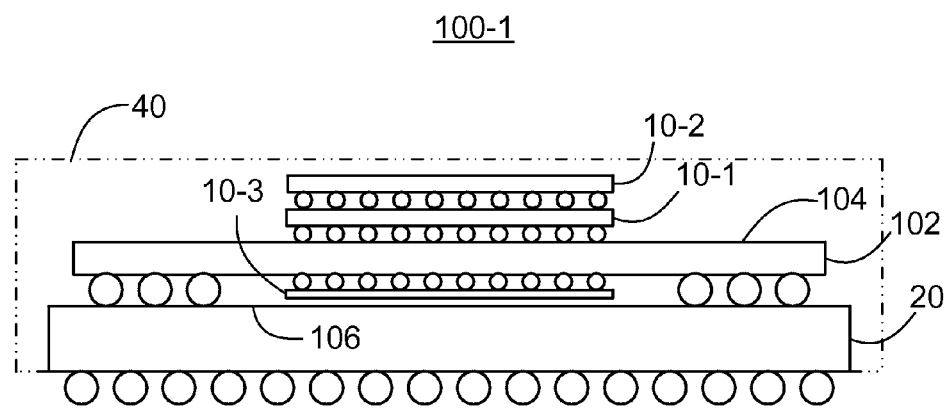
FIG. 2 shows a vertically integrated structure, which schematically illustrates certain features of 3-D integration, and includes an interposer having novel features.

FIG. 2 shows an alternative vertically integrated structure 100-1, which includes certain features of 3-D integration, albeit again with certain novel features of the interposer 102. In this example, the respective semiconductor chips 10-1, 10-2 are disposed one atop the other, with one of the two chips being connected to the first major surface 104 of the interposer 102. An optional further semiconductor chip 10-3 may be disposed beneath the interposer 102 and may be electrically connected to suitable terminals on the second major surface 106 of the interposer 102.

In a broad aspect, the interposer 102 is formed from a specific material—not the conventional silicon material— but rather a heretofore underutilized material; namely, glass. For example, the interposer may include quartz, glass, glass-ceramic, oxide glass, ion exchanged glass, other types of glass, and combinations thereof. Suitable glass or glass ceramic materials may include suitable glass compositions, such as soda lime glass ($SiO_2$, $Na_2O$, CaO, etc.), metallic alloy glasses, ionic melt glass, etc. In some applications, the interposer 102 may include a very high strength glass, formed from conventional glass that is enhanced by chemical strengthening (ion exchange), such as Corning Gorilla® Glass available from Corning Incorporated. Such glass may be formed from alkali aluminosilicate glass or alkali aluminoborosilicate glass.

There are notable characteristics of glass that have been considered in choosing the material to implement the interposer 102. These characteristics include: (1) low loss tangent (e.g., of about 0.0058 @ 5 GHz), (2) good dielectric constant (e.g., of about 5.1 @ 1-10 GHz), (3) high surface resistivity (e.g., of about $1\times e17$ Ohm/sq), (4) good chemical resistance, (5) good dielectric breakdown strength, (6) large range of available thicknesses, (7) good homogeneity and isotropicity, (8) proven track record in industry applications, (9) capable of incorporating precision blind holes and precision through holes, (10) high dimensional stability, (11) high surface cleanliness, (12) highly cost effective material and highly available, and (13) does not contribute to conductive anodic filament (CAF) failures.

In addition to the above characteristics, it has been discovered that significant advantages in the vertical integration of semiconductor chips 10 may be achieved when the interposer 102 is formed from glass. Specifically, the designer is provided with mechanisms for achieving degrees of design freedom in at least the CTE of the interposer 102, which may be used to engineer the element in a way that reduces CTE mismatches and increases the reliability and durability of the overall package 100. This flexibility is highly advantageous in the context of the embodiments disclosed herein because the problem of CTE mismatch in a vertically integrated package is not insignificant. Indeed, the CTE of the semiconductor chips (e.g., silicon chips) 10-1, 10-2, 10-3 is on the order of 2-3 ppm/° C., while the CTE of the organic package substrate 20 is on the order of about 15-20 ppm/° C. On the one hand, when the CTE of the interposer 102 is closer to that of the semiconductor chips 10-1, 10-2, 10-3, then the connective mechanism 30-3, between the interposer 102 and the package substrate 20 may be at risk of undue stress and premature failure. On the other hand, when the CTE of the interposer 102 is closer to that of the organic package substrate 20, then the integrity of the connective mechanisms 30-1, 30-2 as between the semiconductor chips 10-1, 10-2 and the interposer 102 may be at risk of failure.

In accordance with embodiments herein, however, the glass interposer 102 exhibits characteristics that address the CTE matching issues at both levels of the stack, thereby increasing the reliability of the overall structure 100. With reference to FIGS. 3-7, the embodiments of the interposer 102 employ at least two layers of glass material, each layer with a potentially different CTE and/or thickness, in a laminated structure, yielding a composite interposer 102 with improved performance characteristics. In particular the composite interposer 102 may provide a gradation in the CTE through the interposer 102, which results in buffering strain between the semiconductor chips 10-1, 10-2 and the organic package substrate 20, which reduces CTE mismatch issues and increases reliability and assembly yields of the structure 100.

Figure 3:
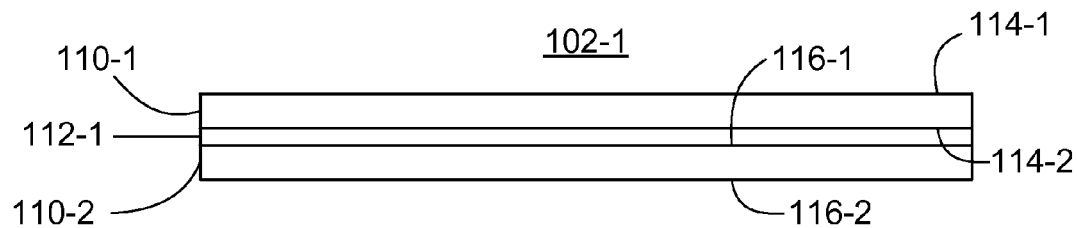
FIGS. 3-7 show respective examples of multi-layer interposers that may be used to implement the embodiments herein.

With reference to FIG. 3, an embodiment of the interposer 102-1 includes: a first glass substrate 110-1, a second glass substrate 110-2, and an interface 112-1 disposed between the first and second glass substrates 110-1, 110-2. The first glass substrate 110-1 has first and second opposing major surfaces 114-1, 114-2, and the second glass substrate 110-2 also has first and second opposing major surfaces 116-1, 116-2. The interface 112-1 is disposed between the first and second glass substrates 110-1, 110-2 in such a way that the second major surface 114-2 of the first glass substrate 110-1 is joined to the first major surface 116-1 of the second glass substrate 110-2. Although only two layers 110-1, 110-2 are illustrated in this embodiment, it should be understood that alternative embodiments may be obtained by adding further layers 110 through additional interfaces 112.

In the case of the embodiment of FIG. 3, the interface 112-1 may be formed from a compliant adhesive material, such as a UV curable adhesive, a UV curable epoxy, curable based adhesives, and the like. With respect to manufacturing considerations, the thickness of the adhesive interface 112-1 should be as thin as possible, such as on the order of 10-20 microns. Once the layers 110-1, 110-2 are interconnected via the interface 112-1, then through holes may be introduced using any of the known methodologies, such as laser or CNC drilling, or laser damage and etch (LDE).

Further features of the interposer 102-1 of FIG. 3 include that the first glass substrate 110-1 has a first coefficient of thermal expansion (CTE1), the second glass substrate 110-2 has a second coefficient of thermal expansion (CTE2), and the CTE1 is different from CTE2. For example, when the first major surface 114-1 of the first glass substrate 110-1 operates to engage the one or more semiconductor chips 10-1, 10-2, and the second major surface 116-2 of the second glass substrate 110-2 operates to engage the organic package substrate 102, then CTE1 is less than CTE2. For example, one or more embodiments may adhere to the following relationship: $1 \leq CTE1$ ppm/° C.$\leq 10$ and $5 \leq CTE2$ ppm/° C.$\leq 15$. Additionally or alternatively, one or more embodiments may adhere to the following relationship: $3 \leq CTE1$ ppm/° C.$\leq 5$ and $8 \leq CTE2$ ppm/° C.$\leq 10$.

Figure 4:
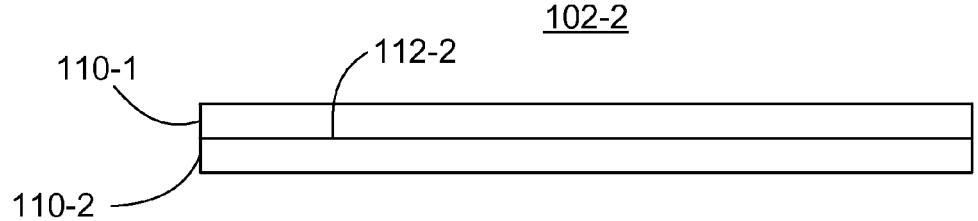

With reference to FIG. 4, an alternative embodiment of an interposer 102-2 may employ some of the same elements of the interposer 102-1 of FIG. 3, such as the first glass substrate 110-1, and the second glass substrate 110-2. The embodiment of FIG. 4, however, employs a different interface 112-2, namely, an oxide bond, such as a silicon-oxide bond. The interface 112-2, despite being different in kind from the interface 112-1, nevertheless is disposed between the first and second glass substrates 110-1, 110-2 in such a way that the second major surface 114-2 of the first glass substrate 110-1 is joined to the first major surface 116-1 of the second glass substrate 110-2 (where certain of the reference identifiers of the surfaces being omitted for clarity).

The interposer 102-2 of FIG. 4 may also include similar features as the interposer 102-1 in terms of the CTE1 and CTE2 characteristics of the first glass substrate 110-1 and the second glass substrate 110-2, respectively.

In terms of manufacturing the interposer 102-2, the respective first and second glass substrates 110-1, 110-2 are cleaned and may be joined using a suitable oxide promoting process, such as application of temperature (e.g., room temperature) and pressure (e.g. relatively high pressure). Chemical bonds are thereby initiated between silicon and oxygen. Thereafter, this structure is heated to a higher temperature, such as about 400° C. or higher to remove any hydroxyl bonds. The resultant silicon-oxygen bond, which is the backbone of most glass structures, eliminates the need for a separate adhesive component. Once the layers 110-1, 110-2 are interconnected via the interface 112-2, then through holes may be introduced using any of the know methodologies, such as laser or CNC drilling, or laser damage and etch (LDE).

Figure 5:
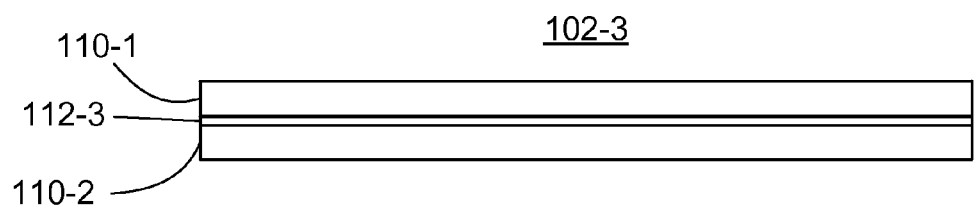

With reference to FIG. 5, a further alternative embodiment of an interposer 102-3 may employ some of the same elements of the other interposers 102-1 and 102-2. For example, the interposer 102-3 may again employ the first glass substrate 110-1, and the second glass substrate 110-2. The embodiment of FIG. 5, however, employs yet a different interface 112-3, namely, an intermediate glass material, such as glass material having a melting temperature significantly lower than melting temperatures of the first and second glass substrates 110-1, 110-2. Similar to the other embodiments, the interface 112-3 is disposed between the first and second glass substrates 110-1, 110-2 in such a way that the second major surface 114-2 of the first glass substrate 110-1 is joined to the first major surface 116-1 of the second glass substrate 110-2 (again, certain of the reference identifiers of the surfaces being omitted for clarity).

The interposer 102-3 of FIG. 5 may also include similar features as the other interposers 102-1, 102-2 in terms of the CTE1 and CTE2 characteristics of the first glass substrate 110-1 and the second glass substrate 110-2, respectively.

In terms of manufacturing the interposer 102-3, the respective first and second glass substrates 110-1, 110-2 are cleaned and positioned with the intermediate glass material of the interface 112-3 therebetween. Next, the intermediate glass material is heated to a sufficient degree to melt in at least some portions thereof. By way of example, a laser may be employed to melt the intermediate glass material, thereby joining the first and second glass substrates 110-1, 110-2 together. Once again, after the layers 110-1, 110-2 are interconnected via the interface 112-3, then through holes may be introduced using any of the know methodologies, such as laser or CNC drilling.

Figure 6:
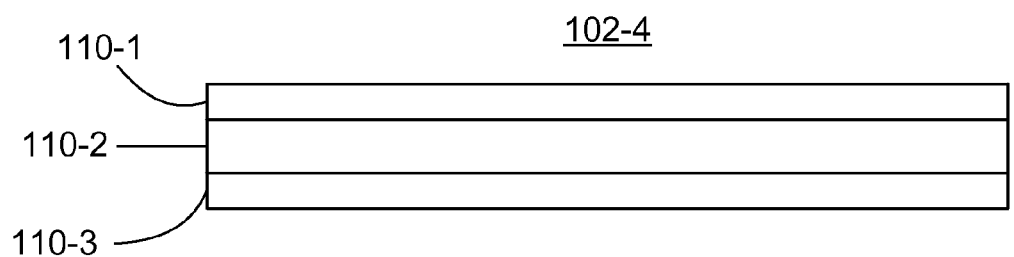
Figure 7:
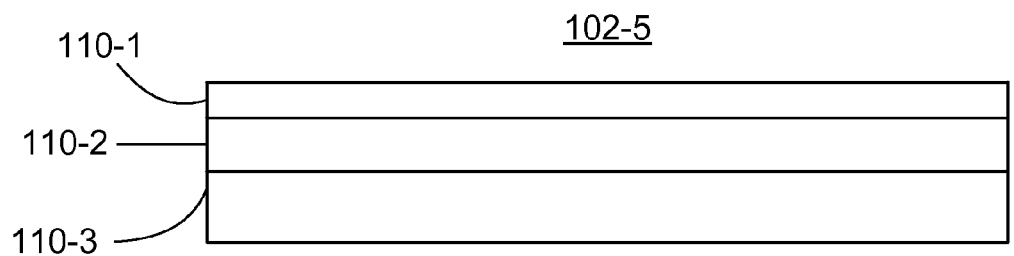

With reference to FIGS. 6 and 7, and as noted above, alternative embodiments may be obtained by adding at least one further layer 110-3 through an additional interface 112-4. In the embodiments of FIGS. 6 and 7, the respective interposers 102-4 and 102-5 each employ three glass layers: a first glass substrate 110-1 having first and second opposing major surfaces, a second glass substrate 110-2 having first and second opposing major surfaces, and a third glass substrate having first and second opposing major surfaces. The first and second glass substrates 110-1, 110-2 are fused such that the second major surface of the first glass substrate 110-1 is connected to the first major surface of the second glass substrate 110-2. The fusion may be accomplished using any of the techniques disclosed or suggested herein, such as one or more of the interfaces 112. The second and third glass substrates 110-2, 110-3 are also fused such that the second major surface of the second glass substrate 102-2 is connected to the first major surface of the third glass substrate 102-3. Again, the fusion as between the second and third glass substrates 110-2, 110-3 may be accomplished using any of the techniques disclosed or suggested herein, such as one or more of the interfaces 112.

The first glass substrate 110-1 has a first coefficient of thermal expansion (CTE1), the second glass substrate 110-2 has a second coefficient of thermal expansion (CTE2), and the third glass substrate 110-3 has a third coefficient of thermal expansion (CTE3). At least two of CTE1, CTE2, and CTE3 are different, and alternatively all of the CTEs may be different. In order to provide concrete examples, it is assumed that each of the interposers 102-4 and 102-5 are employed in the following configuration: the first major surface (the upper surface as shown) of the first glass substrate 110-1 is adapted to engage the one or more semiconductor chips 10-1, 10-2, and the second major surface (the lower surface as shown) of the third glass substrate 110-3 is adapted to engage the organic package substrate 20.

As to the specific embodiment illustrated in FIG. 6, in one adaptation, CTE1 may be less than CTE2, and CTE3 may be less than CTE2. Stated another way, the CTE2 of the middle, second glass substrate 110-2 may be highest as compared to the other CTEs. For example, in one or more embodiments, the CTEs may adhere to the following relationship: $1 \leq CTE1$ ppm/° C.$\leq 10$; $5 \leq CTE2$ ppm/° C.$\leq 15$; and $1 \leq CTE3$ ppm/° C.$\leq 10$. Alternatively, in one or more embodiments, the CTEs may adhere to the following relationship: $3 \leq CTE1$ ppm/° C.$\leq 5$; $8 \leq CTE2$ ppm/° C.$\leq 10$; and $3 \leq CTE3$ ppm/° C.$\leq 5$.

As to the specific embodiment illustrated in FIG. 7, in one adaptation, CTE1 may be less than CTE2, and CTE2 may be less than CTE3. Stated another way, there may be a stepwise, but increasing change in the CTE from the first glass substrate 110-1, to the second glass substrate 110-2, to the third glass substrate 110-3. For example, in one or more embodiments, the CTEs may adhere to the following relationship: $1 \leq CTE1$ ppm/° C.$\leq 10$; $3 \leq CTE2$ ppm/° C.$\leq 12$; and $5 \leq CTE3$ ppm/° C.$\leq 15$. Alternatively, in one or more embodiments, the CTEs may adhere to the following relationship: $3 \leq CTE1$ ppm/° C.$\leq 5$; $5 \leq CTE2$ ppm/° C.$\leq 8$; and $8 \leq CTE3$ ppm/° C.$\leq 10$.

As is implied (but not required) by the illustrations of FIGS. 3-7, the respective thicknesses of the first, second, and third glass substrates 110 may be the same or may differ to one degree or another. In most cases, thicknesses of the glass substrates 110 will fall into some range. For example, contemplated thickness ranges include between about 50 um and 700 um. In is noted, however, that the thicknesses of each of the layers 110 in a two layered or three layered structure disclosed herein may be adjusted such that the total thickness requirement is met and at the same time, the warpage of the interposer is minimized. If a design goal is primarily to reduce the warpage of the multi-layered structure, then one can adjust both thickness and CTEs to achieve the minimal warpage. A notable objective is getting a close CTE match between the semiconductor chip and the first layer of glass and a close CTE match between the organic substrate and the second layer of the glass.

Although the disclosure herein has been described with reference to particular embodiments, it is to be understood that these embodiments are merely illustrative of the principles and applications of the embodiments herein. It is therefore to be understood that numerous modifications may be made to the illustrative embodiments and that other arrangements may be devised without departing from the spirit and scope of the present application.

The invention claimed is:

1. An interposer for interconnecting one or more semiconductor chips with an organic substrate in a semiconductor package, the interposer comprising:
    a first glass substrate having first and second opposing major surfaces, the first glass substrate having a first coefficient of thermal expansion (CTE1);
    a second glass substrate having first and second opposing major surfaces, the second glass substrate having a second coefficient of thermal expansion (CTE2); and
    an interface disposed between the first and second glass substrates and joining the second major surface of the first glass substrate to the first major surface of the second glass substrate, wherein the interface is formed from an intermediate glass material having a melting temperature lower than melting temperatures of the first and second glass substrates, CTE1 is less than CTE2, the first major surface of the first glass substrate operates to engage the one or more semiconductor chips, and the second major surface of the second glass substrate operates to engage the organic substrate.

2. The interposer of claim 1, wherein $1 \leq CTE1$ ppm/° C.$\leq 10$ and $5 \leq CTE2$ ppm/° C.$\leq 15$.

3. The interposer of claim 1, wherein $3 \leq CTE1$ ppm/° C.$\leq 5$ and $8 \leq CTE2$ ppm/° C.$\leq 10$.

4. An interposer for interconnecting one or more semiconductor chips with an organic substrate in a semiconductor package, the interposer comprising:
    a first glass substrate having first and second opposing major surfaces, the first glass substrate having a first coefficient of thermal expansion (CTE1);
    a second glass substrate having first and second opposing major surfaces, the second glass substrate having a second coefficient of thermal expansion (CTE2);
    a third glass substrate having first and second opposing major surfaces, the third glass substrate having a third coefficient of thermal expansion (CTE3);
    a first intermediate glass material disposed between the second major surface of the first glass substrate and the first major surface of the second glass substrate, the first intermediate glass material having a melting temperature lower than melting temperatures of the first and second glass substrates;

a second intermediate glass material disposed between the second major surface of the second glass substrate and the first major surface of the third glass substrate, the second intermediate glass material having a melting temperature lower than melting temperatures of the first and second glass substrates, wherein:

the first and second glass substrates are fused by the first intermediate glass material such that the second major surface of the first glass substrate is connected to the first major surface of the second glass substrate, the second and third glass substrates are fused by the second intermediate glass material such that the second major surface of the second glass substrate is connected to the first major surface of the third glass substrate, and the first major surface of the first glass substrate is adapted to engage the one or more semiconductor chips, and the second major surface of the third glass substrate is adapted to engage the organic substrate.

5. The interposer of claim 4, wherein CTE1 is less than CTE2, and CTE3 is less than CTE2.

6. The interposer of claim 5, wherein $1 \leq CTE1$ ppm/° C.$\leq 10$; $5 \leq CTE2$ ppm/° C.$\leq 15$; and $1 \leq CTE3$ ppm/° C.$\leq 10$.

7. The interposer of claim 5, wherein $3 \leq CTE1$ ppm/° C.$\leq 5$; $8 \leq CTE2$ ppm/° C.$\leq 10$; and $3 \leq CTE3$ ppm/° C.$\leq 5$.

8. The interposer of claim 4, wherein CTE1 is less than CTE2, and CTE2 is less than CTE3.

9. The interposer of claim 8, wherein $1 \leq CTE1$ ppm/° C.$\leq 10$; $3 \leq CTE2$ ppm/° C.$\leq 12$; and $5 \leq CTE3$ ppm/° C.$\leq 15$.

10. The interposer of claim 8, wherein $3 \leq CTE1$ ppm/° C.$\leq 5$; $5 \leq CTE2$ ppm/° C.$\leq 8$; and $8 \leq CTE3$ ppm/° C.$\leq 10$.

11. A method of producing a semiconductor package, comprising:

providing at least one semiconductor chip;

providing an organic substrate; and disposing an interposer between the semiconductor chip and the organic substrate, wherein:

the interposer includes: (i) a first glass substrate having first and second opposing major surfaces, the first glass substrate having a first coefficient of thermal expansion (CTE1); (ii) a second glass substrate having first and second opposing major surfaces, the second glass substrate having a second coefficient of thermal expansion (CTE2); and (iii), an intermediate glass material having a melting temperature lower than melting temperatures of the first and second glass substrates, the intermediate glass material being disposed between the second surface of the first glass substrate and the first surface of the second glass substrate; and applying a laser to the intermediate glass material to melt the intermediate glass material, thereby fusing the first glass substrate and the second glass substrates such that the second major surface of the first glass substrate is connected to the first major surface of the second glass substrate, wherein:

CTE1 is less than CTE2, the first major surface of the first glass substrate directly or indirectly engages the at least one semiconductor chip, and the second major surface of the second glass substrate directly or indirectly engages the organic substrate.

12. The method of claim 11, wherein one of:
$1 \leq CTE1$ ppm/° C.$\leq 10$ and $5 \leq CTE2$ ppm/° C.$\leq 15$; and
$3 \leq CTE1$ ppm/° C.$\leq 5$ and $8 \leq CTE2$ ppm/° C.$\leq 10$.

13. The method of claim 11, wherein:

the interposer further comprises a third glass substrate having first and second opposing major surfaces, the third glass substrate having a third coefficient of thermal expansion (CTE3), the interposer further comprises a second intermediate glass material having a melting temperature lower than melting temperatures of the first and second glass substrates, the second intermediate glass material being disposed between the second major surface of the second glass substrate and the first major surface of the third glass substrate, the method further comprises applying the laser to the second intermediate glass material to melt the intermediate glass material, thereby fusing the first glass substrate and the second glass substrates such that the second major surface of the second glass substrate is connected to the first major surface of the third glass substrate, the first major surface of the first glass substrate directly or indirectly engages the at least one semiconductor chip, and the second major surface of the third glass substrate directly or indirectly engages the organic substrate.

14. The method of claim 13, wherein CTE1 is less than CTE2, and CTE3 is less than CTE2.

15. The method of claim 14, wherein one of:
$1 \leq CTE1$ ppm/° C.$\leq 10$; $5 \leq CTE2$ ppm/° C.$\leq 15$; and $1 \leq CTE3$ ppm/° C.$\leq 10$; and
$3 \leq CTE1$ ppm/° C.$\leq 5$; $8 \leq CTE2$ ppm/° C.$\leq 10$; and $3 \leq CTE3$ ppm/° C.$\leq 5$.

16. The method of claim 13, wherein CTE1 is less than CTE2, and CTE2 is less than CTE3.

17. The method of claim 16, wherein at least one of:
$1 \leq CTE1$ ppm/° C.$\leq 10$; $3 \leq CTE2$ ppm/° C.$\leq 12$; and $5 \leq CTE3$ ppm/° C.$\leq 15$; and
$3 \leq CTE1$ ppm/° C.$\leq 5$; $5 \leq CTE2$ ppm/° C.$\leq 8$; and $8 \leq CTE3$ ppm/° C.$\leq 10$.

* * * * *